United States Patent
Corkum

(10) Patent No.: US 6,249,239 B1
(45) Date of Patent: Jun. 19, 2001

(54) POTENTIOMETRIC DAC HAVING IMPROVED RATIOMETRIC OUTPUT VOLTAGE STABILITY

(75) Inventor: David L. Corkum, Attleboro, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/435,299

(22) Filed: Nov. 5, 1999

(51) Int. Cl.[7] .................................................. H03M 1/78
(52) U.S. Cl. ............................................. 341/154; 341/144
(58) Field of Search .................................... 341/154, 148, 341/153, 145, 144

(56) References Cited

U.S. PATENT DOCUMENTS 5,617,091 * 4/1997 Uda ........................................ 341/154
6,163,289 * 12/2000 Ginetti ................................. 341/145

* cited by examiner

*Primary Examiner*—Brian Young
(74) *Attorney, Agent, or Firm*—Russell E. Baumann; Frederick J. Telecky, Jr.

(57) ABSTRACT

A potentiometric digital to analog converter includes switches to electrically connect a string of n resistors between two voltage supplies to charge a first capacitor ($C_1$) through a first tap and store the charge and then to reverse the electrical connections of the string to the two power supplies to charge a second capacitor ($C_2$) through a second tap connected at an inverse location symmetrical about the average voltage of the voltages at the supply connectivity switches and store the charge of the second capacitor. The voltage ($V_A$, $V_B$) on the two capacitors is then averaged to provide a ratiometric output voltage which is insensitive to the drift of values of the string of resistors.

11 Claims, 2 Drawing Sheets

POTENTIOMETRIC DAC HAVING IMPROVED RATIOMETRIC OUTPUT VOLTAGE STABILITY

FIELD OF THE INVENTION

This invention relates generally to potentiometric digital to analog converters (DAC's).

BACKGROUND OF THE INVENTION

DAC's are widely used in the electronic industry. By way of example, many application specific integrated circuits (ASIC's) employ one or more DAC's of the type shown in FIG. 1 in which a string of serially connected resistors connected between two voltage supplies $V_{DD}$ and $V_{SS}$ has a tap provided at a selected point in the string, at $R_{DX}$ in the example, to provide a voltage of a certain fraction of the range between the two voltage supplies at $V_{OUT}$. This simple arrangement has provided a relatively stable ratiometric output on the order of 1%. However, certain applications have tightened accuracy requirements and can no longer tolerate this level of DAC error. It has been estimated that the drift, thermal or temporal, of a 10 bit DAC can be 1–2 LSB (minimum step size) steps. The normalized magnitude, that is, the number of LSB steps, of this drift can be significantly larger for DAC's which span only a fraction of the supply range. Slight differences in impurity doping or in stress relief with change in temperature and over time can cause drift which will change the fractional output of a DAC.

SUMMARY OF THE INVENTION

An object of the invention is to provide a potentiometric DAC having improved output voltage stability. Another object is the provision of a potentiometric DAC which has a ratiometric output voltage having enhanced insensitivity to variability caused by manufacturing, both thermal and temporal, in individual resistor values. Yet another object of the invention is the provision of a potentiometric DAC free of the limitations of the prior art discussed above.

Briefly, in accordance with one embodiment of the invention, first and second single-pole-double-throw switches are connected to both end portions of a string of n serially connected resistors of like value between first and second voltage power supplies. First and second DAC tap positions are located at equal fractions of the difference between the supply voltages above and below the average value of the two voltage supplies. These two tap positions may or may not be symmetric about the DAC center position. The first tap position provides the desired output voltage for a first connectivity of the single-pole-double-throw switches. Likewise, the second tap position provides the desired output for the second connectivity arrangement of the single-pole-double-throw switches. The output voltage of the first tap position is connected to a first plate of a first capacitor by closing a switch during a portion of the first single-pole-double-throw switch connectivity. Similarly, the output voltage of the second tap position is connected to a first plate of a second capacitor by closing another switch during a portion of the second single-pole-double-throw switch connectivity. The first plates of the first and second capacitors are then connected together and to a first plate of a third capacitor by closing commonly activated switches for a brief period. The voltage present on the first plate of the third capacitor after opening the commonly actuated third and fourth switches represents the final DAC output voltage. The first plate of the third capacitor is also connected to the non-inverting input of an operational amplifier (or op-amp). The inverting input of the op-amp output; thereby buffering the DAC output voltage present at the non-inverting op-amp input. All capacitor second plates are connected to a fixed supply voltage. A clocking circuit is used to close switches at each end of the string of resistors to connect the first and second end portions of the string to the first and second voltage supplies, respectively, and to connect the first tap to the first capacitor to charge the capacitor and store the charge. Although an arrangement is described employing equal valued first and second capacitors and sampling tap voltages symmetric about the supply voltage average, equivalent arrangements appropriately varying the preceding quantities are also beneficial. The preferred embodiment employs a circuit with equivalently valued first and second capacitors and a third capacitor value significantly smaller than either the first or second capacitor to avoid voltage drop issues associated with charge redistribution. The clocking circuit then opens the first pole of the switches between the end portions and the voltage supplies and closes the second pole of the switch at each end of the string of resistors to reverse the connection of the voltage supplies to the string, that is, it closes switches to connect the second and first end portions of the string to the first and second voltage supplies, respectively, and connects the second tap to the second capacitor to charge the capacitor and store the charge. The switch between the second tap and the second capacitor is opened and the commonly operated switch is closed to average the charge of the two capacitors and to provide a voltage output of enhanced stability. Although the resistor string is shown and described as being made up of resistors of like value, resistor values of unlike value can be employed as long as the switching taps are symmetrical about the average voltage of the voltages at the supply connectivity switches. It is also to be noted that resistors may be placed between the connectivity switches and power supplies. This arrangement provides a stability benefit for the resistors between the two tap positions and the connectivity switches, and permits switching about the center of the DAC for DACs having equally valued resistors.

Additional objects and advantages of the invention will be set forth in part in the description which follows and in part will be obvious from the description. The objects and advantages of the invention may be realized and attained by means of the instrumentalities, combinations and methods particularly pointed out in the appended claims.

BRIEF DESCRIPTION OF THE DRAWINGS

The accompanying drawings, incorporated in and constituting a part of the specification, illustrates a preferred embodiment of the invention and, together with the description, serve to explain the objects, advantages and principles of the invention. In the drawings.

DETAILED DESCRIPTION OF THE PREFERRED EMBODIMENT

Figure 1:
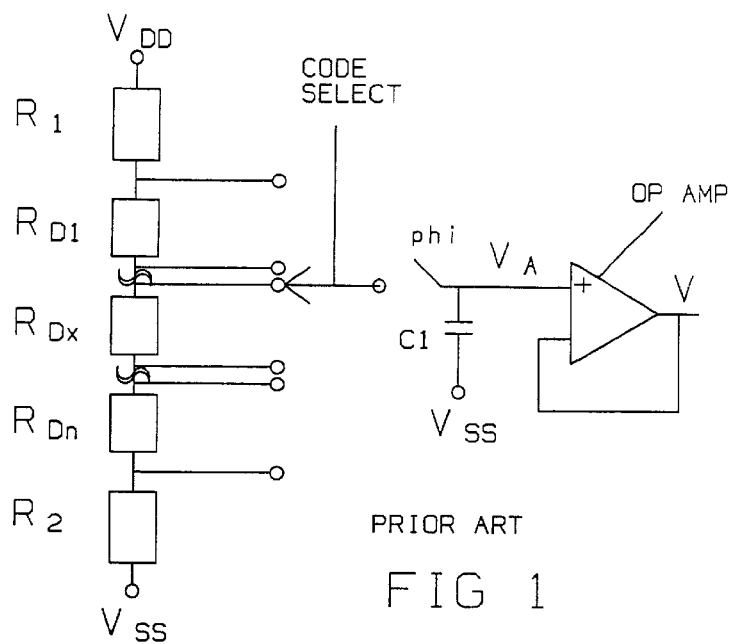
FIG. 1 is a schematic wiring diagram of a conventional DAC.

With reference to FIG. 1 which depicts a DAC made in accordance with the prior art, a string of n resistors $R_{D1}$–$R_{Dn}$ is connected between resistors $R_1$ and $R_2$ which in turn are respectively connected to voltage supplies $V_{DD}$ and $V_{SS}$. A tap is provided on the $V_{DD}$ side of $R_{DX}$ and is connected through a switch phi, such as a FET, to capacitor $C_1$, in turn connected to $V_{SS}$, the capacitor connected to the non-inverting input of operational amplifier OpAmp to provide an output voltage $V_{OUT}$ with feedback to the inverting input. In this arrangement $V_{OUT}$ can be determined as follows:

$$V_{out} = \left[\frac{\sum_{i=x}^{n} R_{Di} + R_2}{R_{DAC} + R_1 + R_2}\right](V_{DD} - V_{ss})$$

$$\text{Where} \quad R_{DAC} = \sum_{i=1}^{n} R_{Di}$$

As noted above, a drift in the value of a resistor, e.g., $R_{D1}$, caused for example, by a slight difference in stress relief over temperature, will result in a change in the fractional output voltage. Accuracy requirements in conventional DAC's were such that small changes in the output voltage caused by drift and the like were acceptable. Currently, however, accuracy requirements are becoming ever more stringent and such drift is becoming more problematic.

Figure 2:
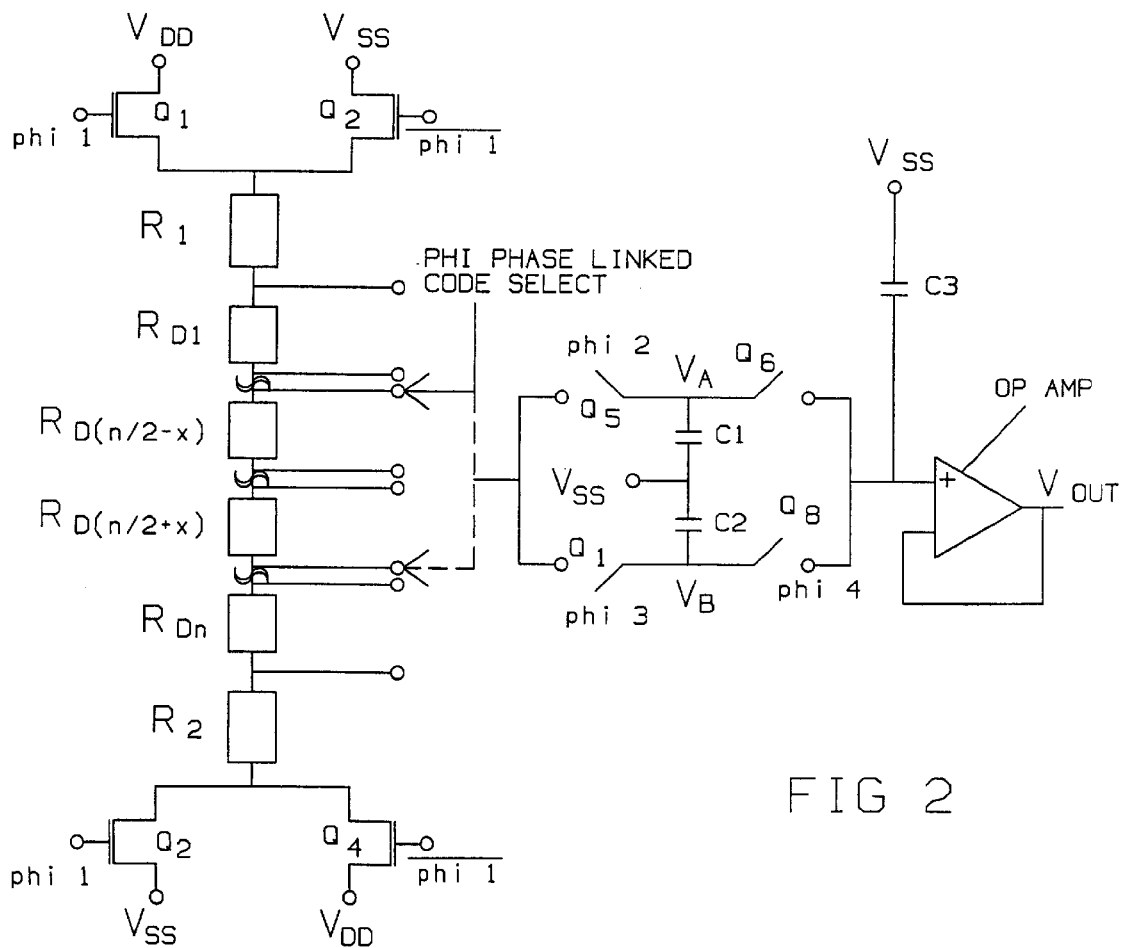
FIG. 2 is a similar diagram of a DAC made in accordance with the invention.

As seen in FIG. 2 and in accordance with one preferred embodiment of the invention, a string of n resistors of like value, $R_{D1}$ to $R_{Dn}$ is connected between $R_1$, and $R_2$ as in the prior art DAC. First and second switches such as FET's $Q_1$, and $Q_2$ are connected between positive supply voltage $V_{DD}$ and the first end portion of the string and between negative supply voltage $V_{SS}$ and the second end portion of the string, respectively. Additionally, third and fourth switches such as FET's $Q_3$ and $Q_4$ are connected between negative supply voltage $V_{SS}$ and the first end portion of the string and between positive supply voltage $V_{DD}$ and the second end portion of the string, respectively. The first and third switches and the second and fourth switches may be formed as single pole, double throw switches.

A first DAC tap is connected at a selected location, e.g., at $R_{D(n/2-x)}$, to provide a desired fractional output ratiometric voltage and is connected to a first capacitor $C_1$, through a switch $Q_5$. A second DAC tap is connected at the inverse location of the string relative to the first tap, i.e., $R_{D(n/2+x)}$ which in turn is connected to a second capacitor $C_2$ through a switch $Q_7$. The opposite sides of capacitors $C_1$, $C_2$ are connected to the negative voltage supply $V_{SS}$. Capacitors $C_1$, $C_2$ are connected to one plate of third capacitor C3 whose other plate is connected to the negative voltage supply $V_{SS}$ and the non-inverting input of an operational amplifier OpAmp through respective switches Q6, Q8 which are commonly operated, that is, they assume identical states of operation, normally open.

Figure 3:
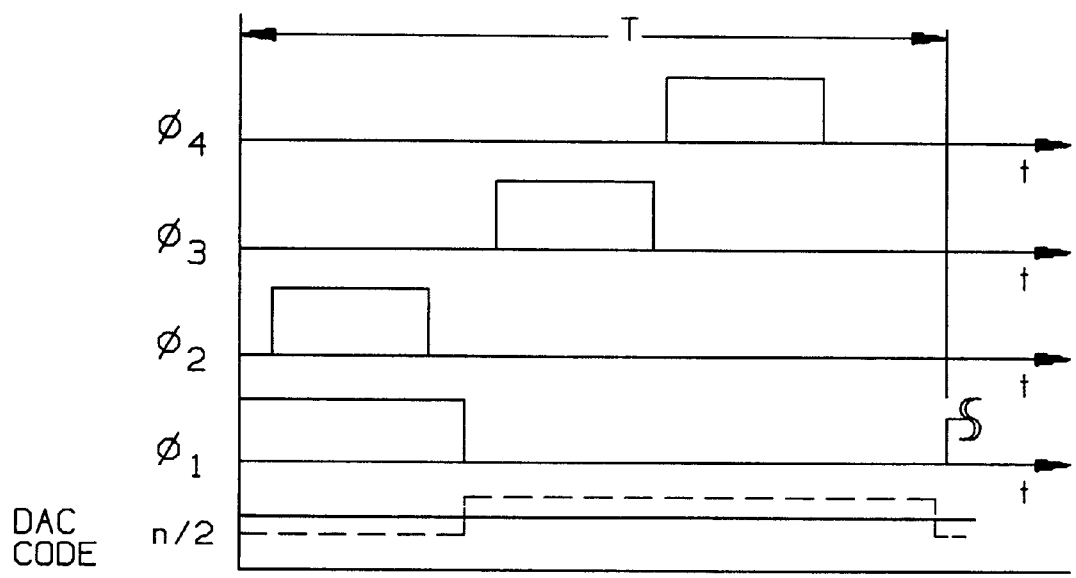
FIG. 3 is a phase logic diagram.

Operation of the DAC is controlled by a phase logic clocking scheme as seen in FIG. 3 according to which a first voltage supply switch connectivity comprising switches $Q_1$, $Q_2$ are closed by signal phi 1. The switch $Q_5$ is then closed by signal phi 2 to charge capacitor $C_1$ as noted by $V_A$, which is then stored. Switch $Q_5$ is then opened along with switches $Q_1$, $Q_2$ and the second voltage supply switch connectivity comprising switches $Q_3$, $Q_4$ are closed, phi 1, reversing the power supplies on the string of resistors. Switch $Q_7$ is closed, phi 3, to charge capacitor $C_2$ as indicated by $V_B$ which charge is stored with switch $Q_7$ being opened. Switches $Q_6$, $Q_8$ are then closed, phi 4, to thereby average the voltages on capacitors $C_1$, $C_2$ in the case that $C_1 \sim C_2$ which results in a ratiometric output voltage with enhanced stability.

Thus, in accordance with the invention, capacitor $C_3$ connected between the non-inverting input of the operational amplifier and voltage supply VSS, preferably is chosen to have a smaller value than capacitors $C_1$, $C_2$ allows for voltage drop issues. If the value of a particular resistor in the string which is not between taps n/2−x and n/2+x changes it will cause one of $V_A$, $V_B$ to increase and, when inversely switched, the other one of $V_A$, $V_B$ to decease with the average of the two being stable. This can be shown by the following:

$$V_A = \left[\frac{\sum_{i=(n/2+x)}^{n} R_{Di} + R_2 + R_{Q2\text{-}on}}{R_1 + R_2 + R_{DAC} + R_{Q2\text{-}on} + R_{Q1\text{-}on}}\right](V_{DD} - V_{SS})$$

$$V_B = \left[\frac{\sum_{i=1}^{(n/2-x)} R_{Di} + R_1 + R_{Q3\text{-}on}}{R_1 + R_2 + R_{DAC} + R_{Q3\text{-}on} + R_{Q4\text{-}on}}\right](V_{DD} - V_{SS})$$

$$V_{OUT} = (V_A + V_B)/2 \cong \left[\frac{R_{DAC} - \sum_{i=(n/2-x)}^{(n/2+x)} R_{Di} + R_1 + R_2 + 2R_{FET\text{-}on}}{R_1 + R_2 + R_{DAC} + 2R_{FET\text{-}on}}\right]$$

Thus the DAC, made in accordance with the invention has a ratiometric output voltage which is insensitive to the drift of R1, R2 and the DAC resistors.

In the above described embodiment, the first and second capacitors are of equal value as are the string of resistors; however, resistors of different values can be employed as long as the switching of the taps is symmetrical about the average voltage of the voltages at the supply connectivity switches. Similarly, the capacitors $C_1$, $C_2$ need not be of equal value. Further, resistors may be placed between the connectivity switches and the power supplies.

When used in an ASIC the described embodiment occupies minimum extra space for the additional FET switches, capacitor and clocking scheme compared to the conventional approach. DAC's made in accordance with the invention are effective for any potentiometric DAC having adequate span mid supply.

Variations and modifications of the invention will become readily apparent to those familiar with DAC'S. For example, de-energizing means other than the described techniques can be employed for averaging the potentiometer tap voltages. The invention should not be considered as limited to the specific embodiment depicted, but rather as defined in the claims.

What is claimed:

1. A potentiometric DAC comprising:
   a string of n serially connected resistors having first and second end portions,
   first, second, third and fourth switches and first and second voltage supplies, the first switch connected to the first voltage supply and the first end portion, the second switch connected to the second voltage supply and the second end portion, the third switch connected to the first end portion and the second voltage supply and the fourth switch connected to the second end portion and the first voltage supply,
   a first tap connected at a selected location of the string of resistors and a second tap connected to a selected location of the string of resistors at an inverse location symmetrical about the average voltage of the voltages at the first and second switches,
   first and second capacitors and an operational amplifier having a non-inverting and an inverting input and an output, a circuit for connecting the first capacitor to the first tap when the first and second switches are closed and for connecting the second capacitor to the second tap when the third and fourth switches are closed and to average the voltages on the first and second capacitors and input the average of the voltages to the non-inverting input of the operational amplifier, and a logic circuit for closing the first and second switches to charge the first capacitor, then to open the first and second switches and close the third and fourth switches to charge the second capacitor.

2. A potentiometric DAC according to claim 1 further comprising fifth, sixth, seventh and eighth switches, the first capacitor connected on a first side to the first tap through the fifth switch and to the non-inverting input through the sixth switch and on a second side to the second voltage supply, the second capacitor connected on a first side to the second tap through the seventh switch and to the non-inverting input through the eighth switch and on a second side to the second voltage supply, and the logic circuit closing the fifth switch along with the first and second switches to charge the first capacitor; then opening the fifth switch along with the first and second switches and closing the seventh switch along with the third and fourth switches to charge the second capacitor; then opening the seventh switch along with the third and fourth switches and closing the sixth and eighth switches to input the average voltage of the first and second capacitors to the non-inverting input of the operational amplifier.

3. A potentiometric DAC according to claim 2 further comprising a third capacitor connected between the non-inverting input of the operational amplifier and the second power supply.

4. A potentiometric DAC according to claim 1 in which the first and third switches and the second and fourth switches, respectively, are single pole, double throw switches.

5. A potentiometric DAC according to claim 1 in which the switches are FET's.

6. A potentiometric DAC according to claim 1 in which the string of n serially connected resistors are of like value.

7. A potentiometric DAC comprising:

a string of n serially connected resistors of like value having first and second end portions, first, second, third and fourth switches and first and second voltage supplies, the first switch connected to the first voltage supply and the first end portion, the second switch connected to the second voltage supply and the second end portion, the third switch connected to the first end portion and the second voltage supply and the fourth switch connected to the second end portion and the first voltage supply, a first tap connected to a selected location of the string of resistors at n/2−x and a second tap connected to a selected location of the string of resistors at n/2+x, first, second and third capacitors and fifth, sixth, seventh and eighth switches and an operation amplifier having a non-inverting and an inverting input and an output, the first capacitor connected on a first side to the first tap through the fifth switch and to the non-inverting input and one side of the third capacitor through the sixth switch and on a second side to the second voltage supply, the other side of the third capacitor connected to the second voltage supply, the second capacitor connected on a first side to the second tap through the seventh switch and to the non-inverting input through the eighth switch and on a second side to the second voltage supply, and a logic circuit for closing the first, second and fifth switches to charge the first capacitor; then to open the first, second and fifth switches and close the third, fourth and seventh switches to charge the second capacitor; then to open the third, fourth and seventh switches and close the sixth and eight switches to input the average voltage of the first and second capacitors to the non-inverting input of the operational amplifier.

8. A potentiometric DAC according to claim 7 in which the first and third switches and the second and fourth switches, respectively, are single pole, double throw switches.

9. A method for providing improved DAC ratiometric input voltage stability comprising the steps of taking a string of serially connected resistors extending from a first end portion to a second end portion, connecting the first and second end portions to first and second voltage supplies, respectively, taking a first tap at a location of the string of resistors having a selected fraction of the normal resistance values of the total of the string of resistors from the first to the second end portions, connecting the first tap to a first capacitor to charge the capacitor and storing the charge, disconnecting the first and second end portions from the first and second voltage supplies and connecting the first and second end portions to the second and first voltage supplies, respectively, taking a second tap at a location of the string of resistors having the same selected fraction of the nominal resistance values of the total of the string of resistors from the second to the first end portions, connecting the second tap to a second capacitor to charge the second capacitor and storing the charge, taking the average voltage to provide a voltage output.

10. A method according to claim 9 in which the resistors of the string are of like value, the first tap is connected to the string of resistors at n/2−x and the second tap is connected to the string of resistors at n/2+x.

11. A method according to claim 9 in which the first and second end portions of the serial resistor string are connected to voltage supplies through series resistors.

\* \* \* \* \*